(12) United States Patent
Gschier

(10) Patent No.: US 7,750,708 B2
(45) Date of Patent: Jul. 6, 2010

(54) CIRCUIT ARRANGEMENT FOR GENERATING A COMPLEX SIGNAL AND THE USE OF THIS CIRCUIT ARRANGEMENT IN A HIGH-FREQUENCY TRANSMITTER OR RECEIVER

(75) Inventor: Tony Gschier, Graz (AT)

(73) Assignee: Austriamicrosystems AG, Unterpremstätten (AT)

( * ) Notice: Subject to any disclaimer, the term of this patent is extended or adjusted under 35 U.S.C. 154(b) by 22 days.

(21) Appl. No.: 11/792,405

(22) PCT Filed: Nov. 29, 2005

(86) PCT No.: PCT/EP2005/012747

§ 371 (c)(1),
(2), (4) Date: Sep. 2, 2008

(87) PCT Pub. No.: WO2006/058708

PCT Pub. Date: Jun. 8, 2006

(65) Prior Publication Data

US 2009/0096494 A1    Apr. 16, 2009

(30) Foreign Application Priority Data

Dec. 2, 2004    (DE)    .................. 10 2004 058 300

(51) Int. Cl.
*H03K 3/00* (2006.01)
(52) U.S. Cl. ........................ 327/238; 327/254
(58) Field of Classification Search ............... 327/238, 327/254
See application file for complete search history.

(56) References Cited

U.S. PATENT DOCUMENTS

| 3,829,713 | A | | 8/1974 | Canning | |
|---|---|---|---|---|---|
| 4,229,668 | A | | 10/1980 | Ebihara et al. | |
| 4,374,332 | A | | 2/1983 | Inami et al. | |
| 5,912,596 | A | * | 6/1999 | Ghoshal | ................. 331/117 R |
| 6,121,465 | A | | 9/2000 | Mohr et al. | |
| 6,891,440 | B2 | * | 5/2005 | Straub et al. | ................. 331/1 R |
| 7,239,209 | B2 | * | 7/2007 | Adan | ...................... 331/117 R |
| 2002/0109556 | A1 | * | 8/2002 | Leenaerts et al. | ....... 331/113 R |
| 2004/0008092 | A1 | * | 1/2004 | Hajimiri et al. | ......... 331/117 R |
| 2004/0061563 | A1 | * | 4/2004 | Akeyama et al. | ........ 331/117 R |

FOREIGN PATENT DOCUMENTS

| DE | 40 18 614 A1 | 12/1990 |
|---|---|---|
| EP | 0 075 189 A1 | 3/1983 |
| EP | 0 654 894 A | 5/1995 |
| GB | 1 483 068 | 8/1977 |
| WO | WO 2004/027977 A | 4/2004 |
| WO | WO 2004/098061 A | 11/2004 |

* cited by examiner

OTHER PUBLICATIONS

Anelli, et al., "Oxidation of Diols with Alkali Hypochlorites Catalyzed by Oxammonium Salts under Two-Phase Conditions," J. Org. Chem., vol. 54, No. 12, 1989, pp. 2970-2972.

*Primary Examiner*—Lincoln Donovan
*Assistant Examiner*—Ryan C Jager
(74) *Attorney, Agent, or Firm*—Cohen Pontani Lieberman & Pavane LLP

(57) ABSTRACT

A circuit arrangement for generating an IQ signal which comprises an oscillator (3) and a frequency divider (4). The oscillator (3) and the frequency divider (4) are arranged in a common current path between the supply and reference potentials (7, 5) in accordance with the proposed principle. It is possible to operate the two function blocks using a common BIAS current and additionally to save components.

16 Claims, 3 Drawing Sheets

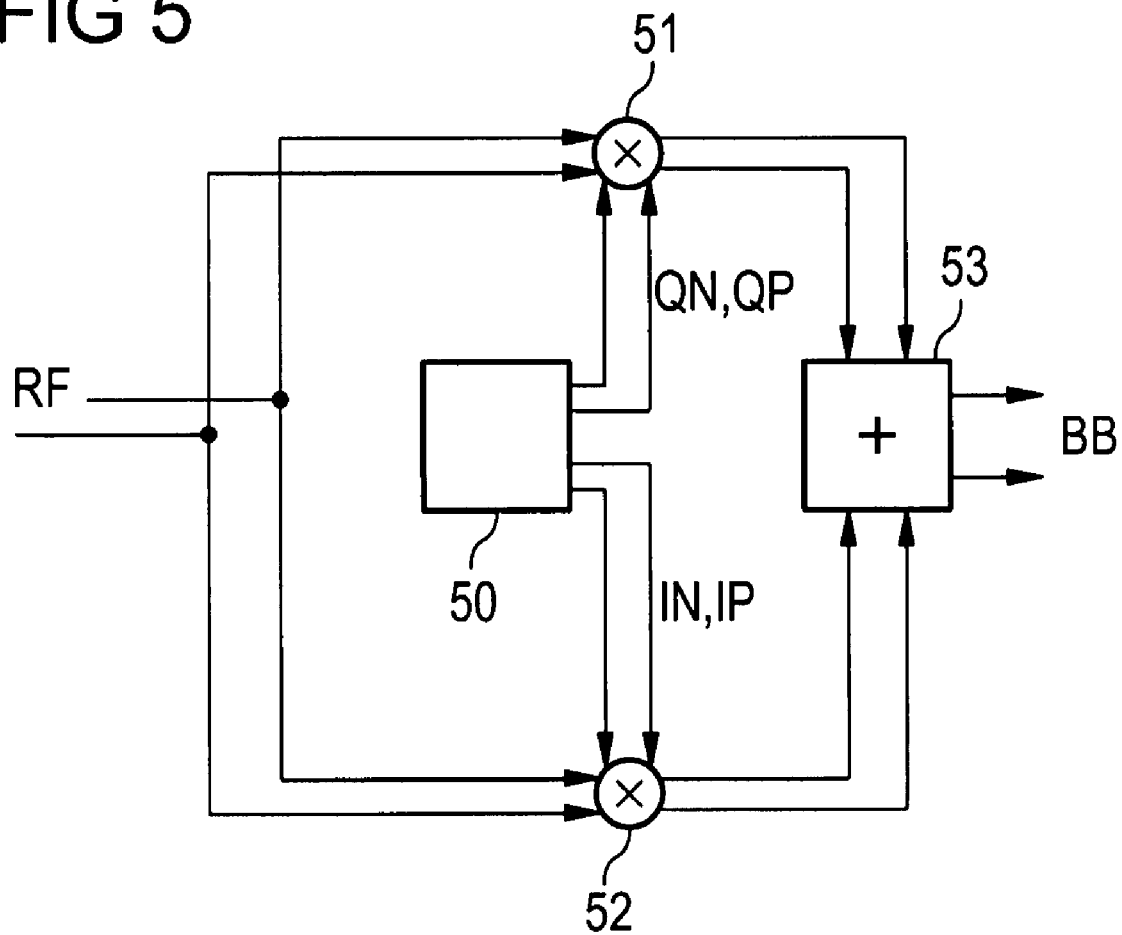

CIRCUIT ARRANGEMENT FOR GENERATING A COMPLEX SIGNAL AND THE USE OF THIS CIRCUIT ARRANGEMENT IN A HIGH-FREQUENCY TRANSMITTER OR RECEIVER

RELATED APPLICATIONS

This is a U.S. national stage of application No. PCT/EP2005/012747, filed on Nov. 29, 2005.

This patent application claims the priority of German patent application no. 10 2004 058 300.5 filed Dec. 2, 2004, the disclosure content of which is hereby incorporated by reference.

FIELD OF THE INVENTION

Circuit arrangement for generating a complex signal, and use thereof in a radio-frequency transmitter or receiver The present invention relates to a circuit arrangement for generating a complex signal and to the use thereof in a radio-frequency transmitter or radio-frequency receiver for providing a local oscillator signal.

BACKGROUND OF THE INVENTION

Radio-frequency transmission and reception appliances usually require a carrier frequency or heterodyne frequency. This is used to effect frequency conversion between a baseband or intermediate frequency and a radio frequency. This normally involves an incoming signal being logically combined with the local oscillator signal in a radio-frequency mixer.

Particularly in the case of homodyne architectures and with the increasing signal bandwidth which is to be processed, it has become usual to perform quadrature signal processing. This in turn requires the local oscillator signal to be supplied to the radio-frequency mixer having been broken down into two orthogonal signal components. These two signal components have the same carrier frequency but differ by a phase offset of 90 degrees. Such a signal is understood as a complex oscillator signal in the present case.

A complex oscillator signal can be generated using an integrated oscillator, for example. The signal obtained in this manner at a carrier frequency is usually broken down into two signal components whose phases have been shifted through 90 degrees relative to one another, namely an inphase component and a quadrature component, between the oscillator and the frequency mixer. Complex signals of this type are therefore also called IQ signals.

FIG. 4 shows a known option for obtaining an IQ signal of this type. An oscillator 1 is provided which generates a carrier signal in the form of a differential signal VCON, VCOP. This signal is supplied to a divider 2 which outputs two signals with a 90-degree phase shift. The output signals from the divider are respectively again in the form of differential signals. Accordingly, the two connections for the inphase signal component are denoted by IN, IP, whereas the quadrature components are denoted by QN, QP. Each of these two function blocks 1, 2 has an associated BIAS current source 39, 40 which is used to provide respective quiescent currents. The oscillator 1 and the divider 2 are connected to one another either via buffers or by means of AC coupling. The output signals IN, IP; QN, QP from the arrangement in FIG. 4 have a particular phase noise component. Conflicting with this is the fact that the desire for ever higher signal quality and bandwidth in telecommunications means that the phase noise in the local oscillator signal needs to be reduced further and further.

The document US 2004/0008092 A1 specifies a system for generating quadrature signals with an oscillator and frequency dividers in a current path.

SUMMARY OF THE INVENTION

It is one object of the present invention to provide a circuit arrangement for generating a complex signal and a use for the circuit arrangement in transmitters or receivers where the phase noise in the complex signal is reduced.

This and other objects are attained in accordance with one aspect of the present invention directed to a circuit arrangement for generating a complex signal, having
  an oscillator,
  a frequency divider, which is coupled to the oscillator for the supply of an oscillation signal, having an output for providing an inphase signal and having an output for providing a quadrature signal which together form the complex signal, the frequency divider being a master-slave flip-flop,
  a supply potential connection and
  a reference potential connection,
  where the oscillator and the frequency divider are arranged in a common current path between the supply and reference potential connections.

The above-described circuit arrangement can be used in a radio-frequency transmitter or receiver for providing a local oscillator signal.

The oscillator and frequency divider function blocks need no longer be in the form of separate blocks and connected in series, but rather provision is made for the oscillator and the frequency divider to be implemented in a single, common current path connected between the supply and reference potentials. It is therefore possible to actuate both the oscillator and the frequency divider using a common BIAS current.

The proposed arrangement of the oscillator and frequency divider in a common current path reduces the phase noise.

Since the oscillator current may be relatively large in comparison with the divider current, it is possible to use relatively small resistors for limiting output signals. This reduces the background noise in the frequency divider even further. The phase noise in the entire circuit arrangement remains constantly below that of the oscillator, for example constantly 6 dB.

The supply voltage for the proposed circuit arrangement can be reduced by virtue of the BIAS current source being integrated in the oscillator's function block.

Preferably, a series circuit connected between the supply and reference potential connections comprises an electrical load, the oscillator, the frequency divider and a BIAS current source.

The common current path and hence the frequency divider and the oscillator are preferably designed using symmetrical circuitry. This reduces the sensitivity towards external interference, inter alia.

The output of the frequency divider for providing the inphase signal and the output for providing the quadrature signal are preferably respectively designed to output differential signals.

The frequency divider is preferably designed as a division-by-two frequency divider. In this case, the oscillator oscillates at double the desired frequency of the complex signal, said frequency being provided by the overall circuit arrangement.

The frequency divider may also have a plurality of cascaded division-by-two frequency dividers. In this case, the overall divider ratio is $2^N$. This is possible with particularly little involvement on account of the simplified implementation of the frequency divider which is possible in the present case. At an overall divider ratio of $2^N$, the supply current in the oscillator remains unchanged, only the current per divider being divided down by $2^N$. To achieve the same output amplitude, the load resistance would need to be increased by $2^N$ in this case. In the case of a preferably used synchronous divider, the signal delay continues to be independent of the number of cascaded divider stages.

The frequency divider is preferably in the form of a master-slave flip-flop.

In this case, the frequency divider preferably comprises a master block and a slave block which are connected to one another in a feedback loop to form a master-slave structure. The master block and the slave block respectively comprise a differential stage and a holding stage, the master differential stage, the master holding stage, the slave differential stage and the slave holding stage preferably being coupled to one another to form the flip-flop structure. Such a structure allows the frequency divider to be designed with a particularly small number of transistors using integrated circuitry.

The differential and holding stages preferably respectively have an emitter-coupled or source-coupled transistor pair, depending on whether the desired application means that the circuit is integrated using metal insulator semiconductor technology or using bipolar circuitry or a combination of the two.

The oscillator is preferably in the form of a tunable oscillator. This means that it is possible to vary the frequency of the complex signal provided.

The tunable oscillator is preferably in the form of a voltage-controlled oscillator, VCO. In this case, the resonant frequency of at least one inductance and at least one capacitance is determined. Preferably, the capacitance is in tunable form. For this, one or more varactor components are provided in the oscillator, for example.

To reduce its damping, the oscillator preferably has a cross-coupled metal oxide semiconductor, MOS, transistor pair. This provides a negative impedance which compensates for the inevitable damping of the inductances and capacitances. This allows an oscillation condition to be met.

If higher gain is desired, a further, cross-coupled transistor pair may be provided to reduce the oscillator's damping. In this case, the two cross-coupled transistor pairs preferably have a different conductivity type for their transistors.

The proposed circuit arrangement is preferably designed using integrated circuitry. In this case, it is possible to use bipolar and/or MOS transistors, depending on the desired specification and the available integration processes.

The proposed circuit arrangement for generating a signal with inphase and quadrature components is particularly suitable for providing a local oscillator signal for application in transmitters and/or receivers for communications engineering, for example mobile radio.

BRIEF DESCRIPTION OF THE DRAWINGS

The invention is explained in more detail below using a plurality of exemplary embodiments with reference to drawings, in which:

FIG. 5 shows an embodiment of a radio-frequency receiver with a circuit arrangement in accordance with the invention.

DETAILED DESCRIPTION OF THE DRAWINGS

Figure 1:
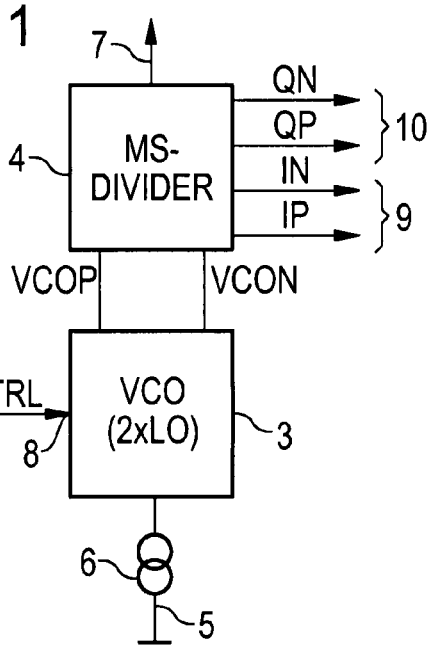
FIG. 1 shows a block diagram of an exemplary embodiment of a circuit arrangement in accordance with the invention.

FIG. 1 shows a circuit arrangement for generating a complex signal. In this case, an oscillator 3 and a frequency divider 4 are coupled to one another in a circuit connection VCOP, VCON of symmetrical design and are arranged in a common current path. Connected between the oscillator 3 and a reference potential connection 5 is a current source 6 which provides a BIAS current. The frequency divider 4 is connected to a supply potential connection 7. Hence, a series circuit comprising the frequency divider 4, the oscillator 3 and the current source 6 is connected between the supply potential connection 7 and the reference potential connection 5, which are therefore arranged in a common current path. The oscillator 3 has a control input 8 which is used to supply a tuning signal VCTRL. This can be used to vary the frequency of the oscillator. The frequency divider 4 has a first output 9, which provides an inphase signal component, and an output 10, which provides a quadrature signal component for the complex signal which is to be generated. The two outputs 9, 10 are respectively designed to provide differential signals IN, IP; QN, QP. Since the differential signals respectively associated with one another are phase-shifted through 180 degrees relative to one another, the output of the frequency divider 4 can also be interpreted to mean that a total of four signals phase-shifted in steps of 90 degrees relative to one another are provided and accordingly have phase angles of 0 degrees, 90 degrees, 180 degrees and 270 degrees.

Since the frequency divider 4 in the present example is a division-by-two frequency divider, the oscillator 3 oscillates at double the frequency of the desired output frequency for the complex signal at the quadrature signal outputs 9, 10.

The current source 6 provides a BIAS current for the oscillator, which is simultaneously also used as a current for the frequency divider 4. In this case, the BIAS current for the oscillator and for the frequency divider does not necessarily have to be of the same magnitude in terms of absolute value.

The inventive stacking of the oscillator 3 and frequency divider 4 blocks for the supply voltage in a common current path results in the advantage of a reduced number of requisite components. A further advantage is obtained in that the phase noise in the arrangement is reduced. This results in improved signal quality for the local oscillator signal which is to be output at the quadrature signal output 9, 10.

Figure 2:
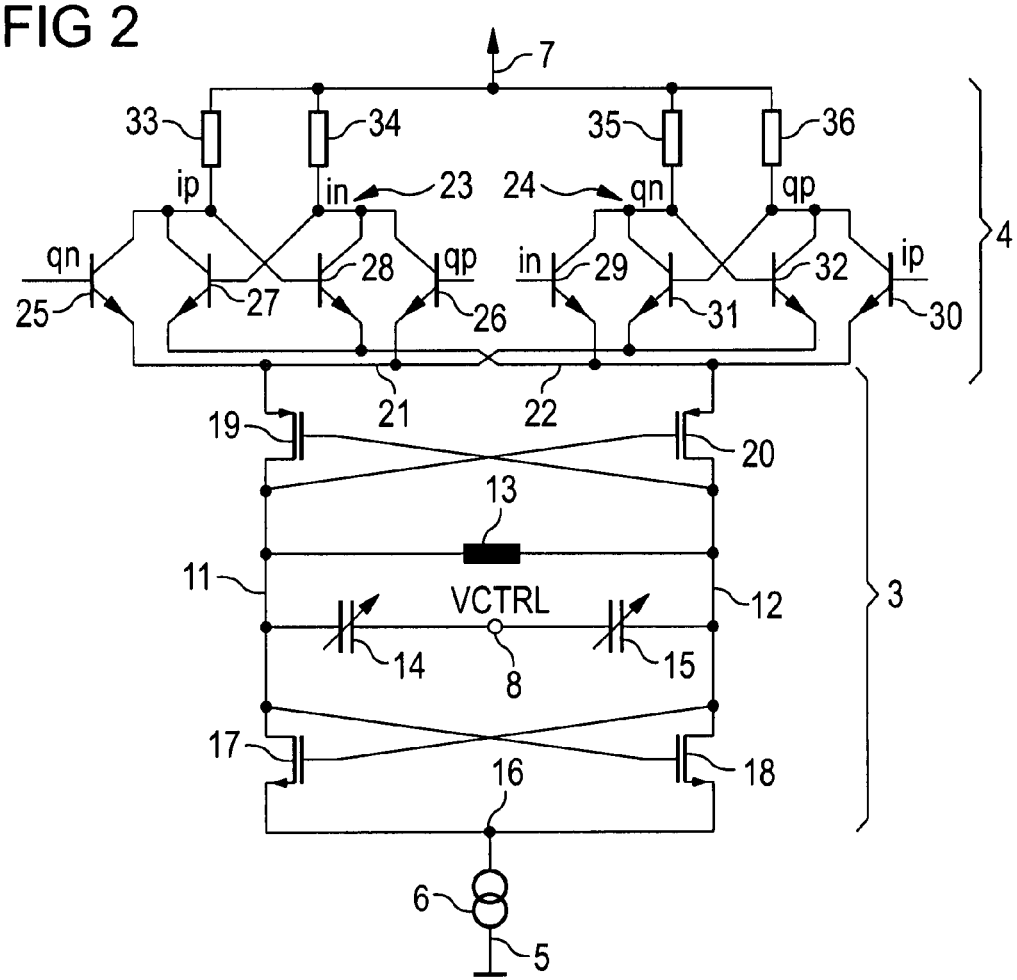
FIG. 2 shows a circuit diagram of a further exemplary embodiment of a circuit arrangement in accordance with the invention.

FIG. 2 shows another exemplary embodiment of a circuit arrangement for providing a complex signal based on the proposed principle using a development of the circuit from FIG. 1. The circuit in FIG. 2 matches the one in FIG. 1 in terms of its basic design, and therefore its design and the advantageous manner of operation are not described again at this juncture.

The oscillator 3 in FIG. 2 is in the form of a tunable LC oscillator. Accordingly, the inductance and capacitance determine the resonant circuit frequency. The design of the oscillator 3 is symmetrical, namely in the form of a voltage-controlled oscillator, VCO. Connected between the symmetrical oscillation nodes 11, 12 of the oscillator is an inductance 13 as an element which determines the resonant circuit frequency. In addition, a pair of varactors 14, 15 is provided, each varactor 14, 15 having a respective connection connected to a respective oscillation node 11, 12. The free connections of the varactors 14, 15 are connected to one another in a control input 8. The control input 8 is used to supply the tuning voltage VCTRL for the tunable oscillator 3. The varactors have a voltage-dependent capacitance and in this way determine the resonant circuit frequency.

A base point 16 of the oscillator 3 is connected to the reference potential connection 5 via the current source 6. In addition, the symmetrical oscillation nodes 11, 12 and the base point 16 have the controlled path of a respective MOS transistor 17, 18 of n-channel type connected between them. The gate connections of the transistors 17, 18 are connected to the respective opposite oscillation node 11, 12 to form a cross-coupling arrangement. The cross-coupled transistor pair 17, 18 is used to reduce the oscillator's damping. For this purpose, a further transistor pair 19, 20 is also provided which is of the p-channel type. A respective one of the transistors 19, 20 has a respective connection for its controlled path connected to a respective connection of the symmetrical oscillation node 11, 12, and has a respective further connection on its controlled path connected to a respective connection of a symmetrical circuit node 21, 22. The symmetrical circuit node 21, 22 forms the base point of the frequency divider 4.

The frequency divider 4 is designed as a master-slave flip-flop. In this case, a master block 23 and a slave block 24 are provided. The master block 23 and the slave block 24 respectively comprise two differential stages. A respective one of these differential stages is used as a holding stage. The two respective differential stages in the master block and in the slave block 23, 24 respectively comprise two emitter-coupled npn transistors 25, 26; 27, 28; 29, 30; 31, 32. Accordingly, the actual core of the flip-flop 4 is formed by four differential stages, which respectively comprise two npn transistors and are operated using emitter-coupled logic, ECL circuitry, for switching. The first differential amplifier comprises two transistors 25, 26 whose emitter connections are connected to one another directly at the first circuit node 21. The collector connection of the first transistor 25 in the first differential amplifier 25, 26 forms a first circuit node IP, and the collector connection of the second transistor 26 forms a second circuit node IN. The base connection of the first transistor 25 is connected to a circuit node QN, while the base connection of the second transistor is connected to a circuit node QP.

In the second differential stage 27, 28, the collector connection of the first transistor 27 is connected to the circuit node IP, while the collector connection of the second transistor 28 is connected to the circuit node IN. The base connection of the first transistor 27 is connected to the circuit node IN, while the base connection of the second transistor 28 is connected to the circuit node IP, so that the transistors 27, 28 form a cross-coupling arrangement with one another. The common emitter node of the second differential stage 27, 28 is connected to the second circuit node 22.

The third differential stage 29, 30 likewise comprises two emitter-coupled npn transistors whose common emitter node is connected to the second circuit node 22. The collector connection of the first transistor 29 in the third differential stage 29, 30 is connected to the circuit node QN, while the collector connection of the second transistor 30 in the third differential stage is connected to the circuit node QP. The base connection of the first transistor 29 is connected to the circuit node IN, while the base connection of the second transistor 30 is connected to the circuit node IP.

The emitter connections of the transistors 31, 32 in the fourth differential stage are connected to one another and to the first circuit node 21. The collector connection of the first transistor 31 in the fourth differential stage is connected to the circuit node QN, and the collector connection of the second transistor 32 in the fourth differential stage is connected to the collector connection QP. The base connection of the first transistor 31 in the fourth differential stage is connected to the collector connection QP, while the base connection of the second transistor 32 in the fourth differential stage is connected to the circuit node QN. Thus, the transistors 31, 32 in the fourth differential stage form a cross-coupling arrangement with one another.

The four circuit nodes QN, QP, IN, IP in turn form the circuit's quadrature signal outputs designed for carrying differential signals.

Each of the four circuit nodes IP, IN, QN, QP is connected to the supply potential connection 7 via a respective resistor 33, 34, 35, 36.

To ensure a clearer illustration, FIG. 2 does not show all the connections between the master block 23 and the slave block 24, but rather these connections are indicated by giving matching labels for the circuit nodes IP, IN, QN, QP.

As can clearly be seen from FIG. 2, the current source 6 is also used for supplying power to the flip-flop arrangement, designed using ECL circuitry, in the frequency divider 4. This reduces the background noise.

The two damping reduction stages 17, 18; 19, 20 provided, which are formed by a respective cross-coupled inverter, allow higher gain.

Since in most applications the VCO current is larger than that of the divider, it is possible to use smaller collector resistors 33 to 36 for limiting output signals. This additionally reduces the background noise in the divider. The total phase noise remains below the phase noise of the oscillator in this case, for example by constant 6 dB.

Figure 3:
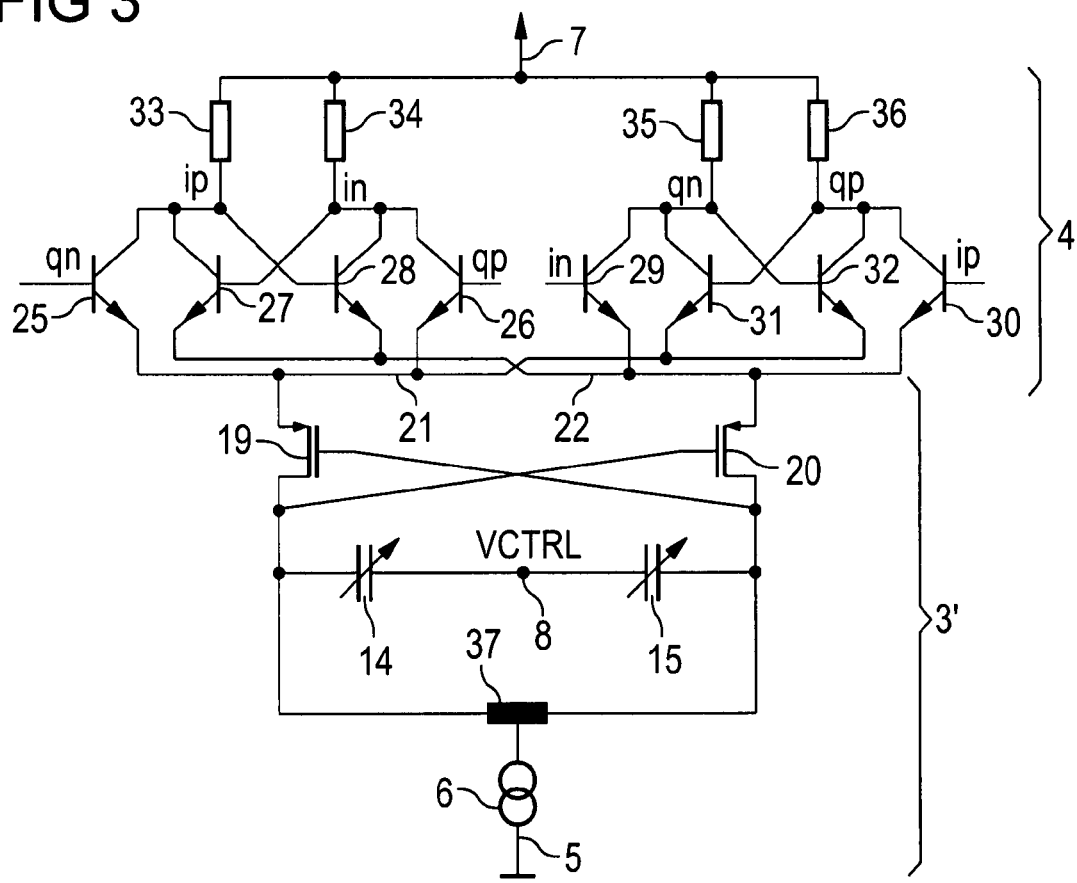
FIG. 3 shows a circuit diagram of a third exemplary embodiment of a circuit arrangement in accordance with the invention.

FIG. 3 shows a third exemplary embodiment of a circuit arrangement based on the proposed principle, whose design likewise corresponds to that of a development of the circuit in FIG. 1. The circuit in FIG. 3 corresponds to a modification of the circuit in FIG. 2, and the aspects in which it matches this circuit are not described again.

To attain a lower supply voltage, the n-channel MOS transistor pair 17, 18 has been omitted in the circuit in FIG. 3. To make it possible to compensate for the resultant lack of coupling between the symmetrical oscillation nodes 11, 12 and the base point 16, an inductance 37 with a centre tap is provided in the circuit shown in FIG. 3 instead of the inductance 13 in FIG. 2. The inductance 37 likewise has a respective connection connected to the symmetrical oscillation nodes 11, 12, but has a centre tap which is connected to the current source 6.

In comparison with the circuit in FIG. 2, the circuit in FIG. 3 is able, as a result of dispensing with a transistor stage, to be operated at a lower supply voltage. In addition, at a slightly lower gain, the circuit likewise exhibits the advantages and variation options which have already been described with reference to FIG. 2.

In alternative embodiments of the circuit examples shown, it is also possible to integrate the current source 6 into the oscillator 3.

Instead of the LC oscillator 3, it is also possible to use other oscillator structures, depending on the desired application.

In addition, other frequency divider structures may be used instead of the master-slave D-type flip-flop structure shown.

In this case, however, it should be noted that the master-slave D-type flip-flop structure shown requires particularly few transistor components.

Instead of the single-stage divider arrangement shown in FIG. 2 or 3, it is also possible to connect a plurality of frequency dividers in series. An overall divider ratio of $2^N$ is then obtained. In this case, the supply of power by the oscillator would then remain unchanged, and only the current per divider would be divided down by $2^N$. To achieve the same output amplitude, the load resistance would need to be increased by $2^N$. Since the frequency divider 4 in FIG. 2 is a synchronous divider, the signal delay is independent of the number of divider stages.

It goes without saying that in the circuits shown in FIGS. 2 and 3 the resistors 33 to 36 can be replaced by inductances or transistors. Instead of the bipolar transistors in the frequency divider, MOS transistors can be used, and this also applies inversely for the MOS transistors 17 to 20. The entire circuit arrangement can likewise be designed using bipolar circuitry, as in the case of MOS circuitry, or another circuitry, depending on the desired application and the available integration process.

The exemplary embodiments shown in FIGS. 1 to 3 are used merely for illustrative purposes, but not to limit the general inventive concept, and can be modified within the scope of action by a person skilled in the art without departing from the inventive concept.

Figure 4:
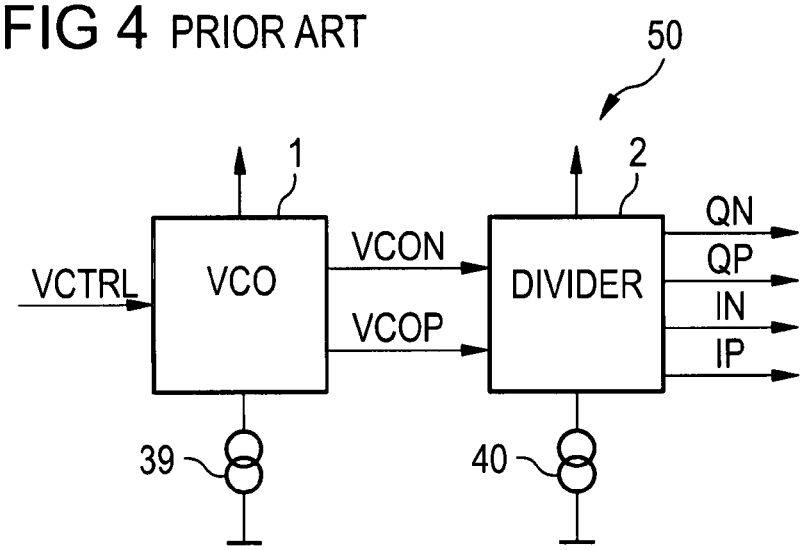
FIG. 4 shows a circuit arrangement for generating a complex signal based on the prior art.

The circuit in FIG. 4 has already been explained in the introduction to the description and will therefore not be described again at this juncture.

FIG. 5 shows a radio-frequency receiver with a circuit arrangement based on the proposed principle. This comprises two mixers 51, 52 whose outputs are connected to one another in a combinational logic element 53. At the output of the combinational logic element, it is possible to tap off a baseband signal BB. A respective input of the mixers 51, 52 is supplied with a radio-frequency signal RF. The circuit arrangement 50 is connected to a respective second input of the mixers 51, 52 such that a first mixer 51 is supplied with the quadrature signal QN, QP and a second mixer 52 is supplied with the inphase signal IN, IP. The circuit is designed for processing differential signals.

The circuit arrangement 50 can also be used alternatively or additionally in corresponding fashion for frequency conversion in transmission arrangements.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

LIST OF REFERENCE SYMBOLS

1 Oscillator
2 Frequency divider
3 Oscillator
3' Oscillator
4 Frequency divider
5 Reference potential connection
6 Current source
7 Supply potential connection
8 Control input
9 Inphase signal output
10 Quadrature signal output
11 Oscillation node
12 Oscillation node
13 Inductance
14 Varactor
15 Varactor
16 Base point
17 Transistor
18 Transistor
19 Transistor
20 Transistor
21 Circuit node
22 Circuit node
23 Master block
24 Slave block
25 Transistor
26 Transistor
27 Transistor
28 Transistor
29 Transistor
30 Transistor
31 Transistor
32 Transistor
33 Resistor
34 Resistor
35 Resistor
36 Resistor
37 Inductance
39 Current source
40 Current source
50 Circuit arrangement
51 Mixer
52 Mixer
53 Combinational logic element
BB Baseband signal
IN Inphase signal
IP Inphase signal
QN Quadrature signal
QP Quadrature signal
RF Radio-frequency signal

The invention claimed is:

1. A circuit arrangement for generating a complex signal, comprising:
    an oscillator for providing an oscillation signal;
    a frequency divider having an output for providing an inphase signal and having an output for providing a quadrature signal which together form a complex signal, the frequency divider comprising a master-slave flip-flop and being coupled to the oscillator to receive the oscillation signal provided by the oscillator;
    a supply potential connection;
    a reference potential connection; and
    a series circuit connected between the supply potential connection and the reference potential connection comprising at least one electrical load, the frequency divider, and the oscillator;
    wherein the oscillator and the frequency divider are arranged in a common current path between the supply and reference potential connections, the frequency divider further comprising transistors which are connected in series with the at least one electrical load.

2. The circuit arrangement according to claim 1, wherein the series circuit further includes a current source in the common current path which is configured to provide a common bias signal for the oscillator and the frequency divider.

3. The circuit arrangement according to claim 1, wherein the common current path is designed using symmetrical circuitry.

4. The circuit arrangement according to claim 1, wherein the output for providing the inphase signal and the output for providing a quadrature signal from the frequency divider each output differential signals.

5. The circuit arrangement according to claim 1, wherein the frequency divider is a division-by-two frequency divider.

6. The circuit arrangement according to claim 1, wherein the frequency divider comprises a master block and a slave block which are coupled to one another to form a master-slave structure and each comprise a differential stage and a holding stage, the master differential stage, the master holding stage, the slave differential stage and the slave holding stage being coupled to one another to form the master-slave flip-flop.

7. The circuit arrangement according to claim 6, wherein the differential stage and the holding stage each include an emitter-coupled or source-coupled transistor pair.

8. The circuit arrangement according to claim 1, wherein the oscillator comprises a tunable oscillator.

9. The circuit arrangement according to claim 1, wherein the oscillator comprises a voltage-controlled LC oscillator having a symmetrical configuration.

10. The circuit arrangement according to claim 1, wherein the oscillator comprises at least one cross-coupled metal oxide semiconductor transistor pair to reduce damping.

11. The circuit arrangement according to claim 10, wherein the oscillator further comprises a complementary conduction type cross-coupled metal oxide semiconductor transistor pair to reduce the damping.

12. The circuit arrangement according to claim 1, wherein the circuit arrangement is designed using integrated circuitry.

13. A radio-frequency transmitter comprising the circuit arrangement according to claim 1.

14. A radio-frequency receiver comprising the circuit arrangement according to claim 1.

15. A circuit arrangement for generating a complex signal, comprising:
   an oscillator for providing an oscillation signal;
   a frequency divider having an output for providing an inphase signal and having an output for providing a quadrature signal which together form a complex signal, the frequency divider comprising a master-slave flip-flop and being coupled to the oscillator to receive the oscillation signal provided by the oscillator;
   a supply potential connection; and
   a reference potential connection;
   wherein the oscillator and the frequency divider are arranged in a common current path between the supply and reference potential connections, and
   wherein the oscillator further comprises a complementary conduction type cross-coupled metal oxide semiconductor transistor pair for reducing damping.

16. A circuit arrangement for generating a complex signal, comprising:
   an oscillator for providing an oscillation signal;
   a frequency divider having an output for providing an inphase signal and having an output for providing a quadrature signal which together form a complex signal, the frequency divider comprising a master-slave flip-flop and being coupled to the oscillator to receive the oscillation signal provided by the oscillator;
   a supply potential connection; and
   a reference potential connection;
   wherein the oscillator and the frequency divider are arranged in a common current path between the supply and reference potential connections; and
   wherein the oscillator comprises an LC circuit arranged in the common path between the supply and reference potential connections.

* * * * *